United States Patent
Yi et al.

(10) Patent No.: US 9,548,654 B2
(45) Date of Patent: Jan. 17, 2017

(54) DC-DC CONVERTER WITH TEMPERATURE, PROCESS AND VOLTAGE COMPENSATED DEAD TIME DELAY

(71) Applicant: Texas Instruments Incorporated, Dallas, TX (US)

(72) Inventors: Jun Yi, Chengdu (CN); Xuechun Ou, Shenzhen (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 134 days.

(21) Appl. No.: 14/634,922

(22) Filed: Mar. 2, 2015

(65) Prior Publication Data

US 2016/0118977 A1    Apr. 28, 2016

Related U.S. Application Data

(63) Continuation of application No. PCT/CN2014/089531, filed on Oct. 27, 2014.

(51) Int. Cl.
| H02M 1/38 | (2007.01) |
| H02M 3/156 | (2006.01) |
| H03K 17/14 | (2006.01) |
| H03K 19/0185 | (2006.01) |
| H03K 5/134 | (2014.01) |

(Continued)

(52) U.S. Cl.
CPC .............. *H02M 1/38* (2013.01); *H02M 3/1588* (2013.01); *H03K 5/134* (2014.07); *H03K 17/145* (2013.01);

(Continued)

(58) Field of Classification Search
CPC .. H02M 1/088; H02M 1/38; H02M 2001/385; H02M 3/156; H02M 3/1588; G05F 3/225; G05F 3/245; G05F 3/267; H03K 17/145

See application file for complete search history.

(56) References Cited

U.S. PATENT DOCUMENTS 6,535,020 B1 *  3/2003  Yin ...................... H03K 17/145
                                        326/26
6,930,534 B1 *  8/2005  Fu ..................... H03K 19/00384
                                        326/108

(Continued)

FOREIGN PATENT DOCUMENTS

| CN | 102170228 A | 8/2011 |
| CN | 103151920 A | 6/2013 |

OTHER PUBLICATIONS

Search Report for PCT/CN2014/089531, dated Jul. 28, 2015 (2 pages).

*Primary Examiner* — Fred E Finch, III
(74) *Attorney, Agent, or Firm* — William B. Kempler; Chares A. Brill; Frank D. Cimino

(57) ABSTRACT

Temperature, process and supply compensated delay circuits, DC to DC converters and integrated circuits are presented in which switch driver dead time delays are provided using a plurality of cascaded CMOS inverter circuits with a first inverter coupled through a diode-connected MOS transistor to a regulated voltage or circuit ground and a MOS capacitor is provided between the first inverter output and the regulated voltage or circuit ground to provide a controlled delay time. A second cascaded CMOS inverter is powered by a compensated voltage which decreases with temperature to operate as a comparator, and certain embodiments include one or more intermediate CMOS inverters to form a level shifting circuit between the second inverter and the final output inverter, with the level shift inverters powered by successively higher compensated voltages that decrease with increasing temperature.

20 Claims, 5 Drawing Sheets

(51) Int. Cl.
*H02M 3/158* (2006.01)
*H03K 5/00* (2006.01)
*G05F 3/26* (2006.01)
*H02M 1/088* (2006.01)

(52) U.S. Cl.
CPC ....... H03K 19/018521 (2013.01); *G05F 3/267* (2013.01); *H02M 1/088* (2013.01); *H02M 2001/385* (2013.01); *H03K 2005/00143* (2013.01)

(56) References Cited

U.S. PATENT DOCUMENTS

| | | | |
|---|---|---|---|
| 7,126,416 B2 | 10/2006 | Ma | |
| 7,362,069 B2 | 4/2008 | Yamamoto et al. | |
| 7,804,379 B2 | 9/2010 | Kris et al. | |
| 2003/0111983 A1 | 6/2003 | Miller et al. | |
| 2004/0095111 A1* | 5/2004 | Kernahan | H02M 3/157 323/282 |
| 2004/0130307 A1 | 7/2004 | Dequina et al. | |
| 2006/0152204 A1 | 7/2006 | Maksimovic et al. | |
| 2006/0193157 A1* | 8/2006 | Ma | H02M 3/156 363/123 |
| 2009/0039842 A1* | 2/2009 | Chen | H02M 3/1584 323/272 |
| 2011/0273914 A1 | 11/2011 | Kim | |
| 2012/0062201 A1 | 3/2012 | Hachiya et al. | |
| 2013/0187715 A1 | 7/2013 | Nagashima | |
| 2014/0368254 A1* | 12/2014 | Lee | H03K 17/165 327/378 |
| 2015/0357904 A1* | 12/2015 | Odell | H02M 3/33515 363/21.13 |

\* cited by examiner

DC-DC CONVERTER WITH TEMPERATURE, PROCESS AND VOLTAGE COMPENSATED DEAD TIME DELAY

REFERENCE TO RELATED APPLICATIONS

This application is a continuation of, and claims priority to and the benefit of, International Application No PCT/CN2014/089531, filed Oct. 27, 2014 and entitled "DC-DC CONVERTER WITH TEMPERATURE, PROCESS AND VOLTAGE COMPENSATED DEAD TIME DELAY", the entirety of which is hereby incorporated by reference.

BACKGROUND

Switching power supplies such as voltage regulators and DC to DC converters typically include one or more switching devices operated by pulse width modulated switching control signals. Various converters include high and low side transistors switched in alternating fashion according to complementary PWM signals. Closing both high and low side switches at the same time, however, can cause temporary short circuit conditions thus reducing converter efficiency. Accordingly, delays referred to as dead times are introduced in the switching control circuitry to ensure that both switches are not turned on at the same time. However, significant delays between opening one switch and closing the other can also reduce the efficiency of a switching converter. Precise control of switching converter dead times is therefore important in achieving high efficiency, and the dead time in switching converters also impacts operating frequency and reliability. Process, supply voltage and temperature variations, however, can lead to variations in dead time delays. Dead time delays are typically created using voltage comparator circuits comparing a threshold voltage to a ramp signal generated by a capacitor charged from a current source, and various approaches have been attempted to compensate voltage comparators, ramp generators and a reference voltage sources for process, voltage and temperature variations. However, decreasing converter output levels for modern computers, smart phones, tablets and other electronic products increasingly lead to higher converter switching frequencies, for example, on the order of 1 MHz. Increased switching frequency reduces the on-time of the converter switches and hence requires shorter dead time delay values, and thus process, voltage and temperature effects on dead time delay values become more pronounced. As result, reduced on-times corresponding with increased converter switching frequency require the response time of the comparator to be very small compared to the length of delay to be achieved. In particular, operation at 1 MHz or above requires that time delays on the order of a few nanoseconds, and conventional voltage comparator circuits have a significant non-zero intrinsic delay or response time typically on the order of hundreds of nanoseconds. Fast responding voltage comparators can be used, but this significantly increases cost. Accordingly, improved dead time delay circuitry is needed for providing short and accurate dead time delay values to facilitate efficient power converter operation over variations in process, voltage and temperature.

SUMMARY

The present disclosure provides DC to DC converter circuits and dead time delay circuitry embodiments compensated for process, voltage and temperature variations, in which cascaded CMOS inverter circuits are used with controlled supply voltages to provide dead time delays for generating pulse width modulated switching control signals to operate high and low side switches. A first inverter is coupled through a MOS diode (e.g., diode-connected MOS transistor) to a regulated voltage VREG or circuit ground and a MOS capacitor is coupled with the first inverter output to provide a controlled dead time delay, and a second cascaded CMOS inverter is powered by a compensated voltage which decreases with temperature to operate as a comparator. Various implementations are possible, and the compensated inverter supply voltage addresses temperature compensation while process variability is compensated through use of an MOS diode and MOS capacitor, while supply variations are compensated through use of a locally regulated supply voltage for the first inverter. Moreover, the use of CMOS inverter circuitry provides a cost effective solution without increased cost and complexity associated with ultra-fast response time voltage comparators and associated ramp generator and threshold voltage circuitry.

Delay circuitry is provided in accordance with one or more aspects of the disclosure, including a first CMOS inverter circuit with a PMOS transistor coupled between a regulated voltage node and a first inverter output node, as well as an NMOS transistor coupled between the output node and a circuit ground or other constant voltage node. A MOS capacitor is coupled between the first inverter output and one of the regulated voltage node and the constant voltage node, and a diode-connected MOS transistor is coupled to provide an impedance between the first inverter circuit and either the regulated voltage node or the constant voltage node, with the MOS capacitor and the diode-connected MOS transistor providing or establishing a first inverter delay. A second CMOS inverter circuit receives the first inverter output and provides a second inverter output, where the second inverter circuit is powered by a first compensated voltage node having a voltage that decreases with increasing temperature. The output of the second inverter circuit is provided directly or indirectly to a CMOS output inverter circuit powered by a supply voltage, with the second inverter effectively operating as a comparator circuit to compare the ramped voltage signal generated by charging or discharging of the MOS capacitor with a threshold established by the compensated voltage used to power the second inverter.

In certain embodiments, the supply voltage node is greater than the voltage at the regulated voltage node, and the regulated voltage is greater than the compensated voltage. One or more intervening CMOS inverters may be provided in certain embodiments between the second inverter and the output inverter to form a level shifting circuit, with the intervening inverter(s) powered by a corresponding compensated voltage which decreases with increasing temperature. A supply circuit in certain embodiments provides one or more compensated voltages as well as the regulated voltage for the cascaded CMOS inverter circuitry using current mirror circuits for temperature, voltage and process compensation.

DC to DC conversion systems are provided according to further aspects of the disclosure, including high and low side switching devices coupled with a switching node, and corresponding high and low side driver circuits for selectively turning the switching devices on or off according to corresponding input signals. A pulse width modulation (PWM) circuit provides high and low side PWM signals to corresponding high and low side delay circuits, which in turn provide the input signals to the switch drivers. The individual delay circuits include a first CMOS inverter powered from a regulated voltage node and receiving the corresponding PWM signal, as well as a diode-connected MOS transistor providing an impedance between the first CMOS inverter and the regulated voltage node or a constant voltage node, and a MOS capacitor coupled with the first inverter output node. The delay circuits also include a second CMOS inverter powered from a compensated voltage node, and an output CMOS inverter powered from a supply voltage node for providing the high or low side input signal to the corresponding driver circuit.

Integrated circuit products are provided in accordance with further aspects of the disclosure, including a PWM circuit with an output providing a PWM signal for control of a DC to DC converter switch, as well as a delay circuit providing a driver input signal at least partially according to the PWM signal with a non-zero temperature compensated delay. The delay circuit includes a first CMOS inverter powered from a regulated voltage node, a MOS diode providing an impedance between the first inverter and either the regulated voltage node or a constant voltage node, and a MOS capacitor coupled with the first inverter output. The delay circuit also includes a second CMOS inverter powered from a compensated voltage which decreases with increasing temperature, as well as an output CMOS inverter powered from a supply voltage to provide the driver input signal based at least partially on a signal from the second inverter output.

DESCRIPTION OF THE DRAWINGS

The following description and drawings set forth certain illustrative implementations of the disclosure in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
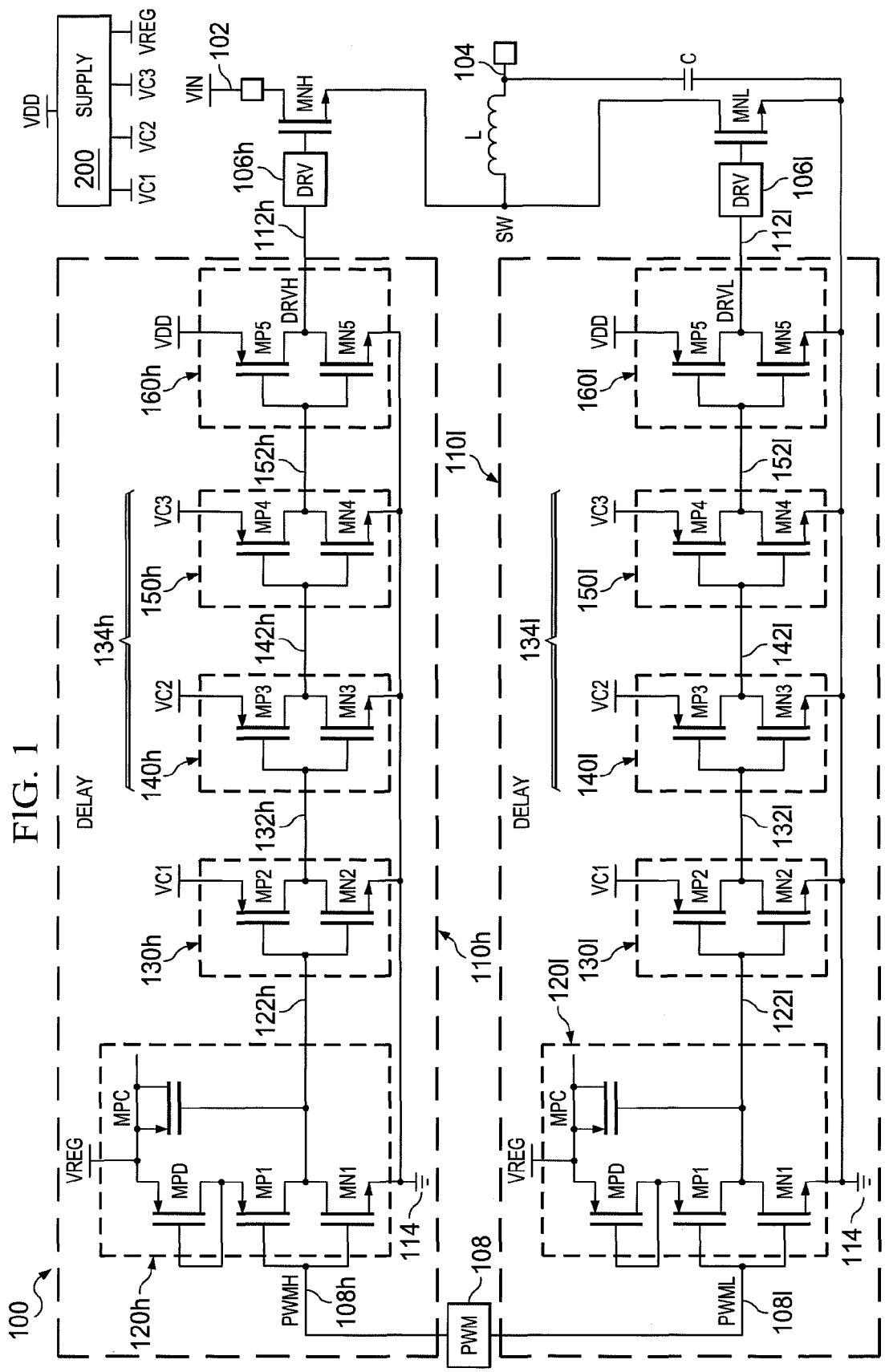
FIG. 1 is a schematic diagram illustrating a DC to DC buck converter system with high and low side switch drivers and corresponding process, voltage and temperature compensated dead time delay circuits including cascaded CMOS inverter circuits, along with a PMOS diode, a PMOS capacitor and a level shifting circuit.

One or more embodiments or implementations are hereinafter described in conjunction with the drawings, wherein like reference numerals are used to refer to like elements throughout, and wherein the various features are not necessarily drawn to scale.

FIG. 1 illustrates a DC to DC conversion system 100 receiving a DC input voltage VIN at an input terminal 102 and providing a regulated DC output voltage to a load (not shown) at an output node or terminal 104. The system 100 provides a buck converter having a high side NMOS transistor switching device MNH connected between the input voltage node 102 and a switching node SW, as well as a low side NMOS switch MNL coupled between the switching node SW and a constant voltage node (e.g., circuit ground) 114. In the illustrated buck converter example, an output inductor L is connected between the switching node SW and the output node 104, and an output capacitance C is connected between the output node 104 and the constant voltage node 114. Although illustrated and described in the context of a buck converter system 100, other DC to DC converter topologies can incorporate the various concepts of the present disclosure, including without limitation boost converters, buck/boost converters, CUK converters, etc. Moreover, while the illustrated conversion system 100 includes both high and low side driver circuits, the various delay circuit concepts of the present disclosure can be employed for generating dead time delays in switching power conversion systems having only a single switch. In the illustrated example, a high side driver circuit 106$h$ provides a switching control signal to operate the high side switch MNH according to a high side input signal DRVH received at a driver circuit input 112$h$, and a low side driver circuit 106$l$ provides a switching control signal to operate the low side switch MNL according to a low side input signal DRVL at node 112$l$ to selectively turn the low side switching device MNL on or off.

A PWM circuit 108 provides high and low side PWM signals PWMH and PWML at corresponding outputs 108$h$ and 108$l$ for controlling the high and low side switches, and may employ any suitable close loop or feedback-based regulation techniques to modulate the voltage at the switching node SW in order to control the voltage at the output node 104 through varying the pulse widths or duty cycles of the PWM signals PWMH and PWML. As further shown in FIG. 1, the system 100 includes high and low side dead time delay circuits 110$h$ and 110$l$, respectively, receiving the PWM signals PWMH and PWML and providing the driver input signals DRVH and DRVL at the nodes 112$h$ and 112$l$ with non-zero process, voltage and temperature compensated delays. In certain implementations, the PWM circuit 108 and the delays circuits 110 are provided as a single integrated circuit product, such as a PWM controller IC, with suitable terminals for connection to external driver circuits 106, or driver circuitry 106$h$ and 106$l$ may be incorporated into the IC. Various embodiments may also include integral high and low switches MNH and MNL and/or an integral output inductor L.

Each of the delay circuits 110$h$ and 110$l$ includes a series of cascade connected CMOS inverters 120, 130, 140, 150 and 160, and each inverter includes a PMOS transistor with a source terminal coupled with (e.g., connected directly or indirectly) a positive voltage and a drain terminal coupled with an inverter output node, as well as an NMOS transistor with a drain coupled to the inverter output and a source coupled with the constant voltage node 114. The individual CMOS inverters also include an input coupled with the gate terminals of the PMOS and NMOS transistors. The PWM circuit 108 in this example provides complementary PWM output signals PWMH and PWML with varying pulse widths to regulate the converter output voltage, with the delay circuits 110 providing dead time delays such that the high and low drivers signals DRVH and DRVL are delayed by a non-zero dead time delay value relative to the PWM output signals PWMH and PWML, respectively. In certain embodiments, the delay provided by the high side delay circuit 110h is different than that provided by the low side delay circuit 110l, although the high and low side dead time delays can be the same in other embodiments.

The high side delay circuit 110h includes a first CMOS inverter circuit 120h comprising a PMOS transistor MP1 having a source terminal coupled with a regulated voltage node VREG, a gate terminal coupled with a delay input node 108h to receive the high side delay circuit input voltage signal PWMH from the PWM circuit 108, and a drain terminal coupled with a first inverter output node 122h. The first inverter 120h also includes a first NMOS transistor MN1 with a drain terminal coupled with the output node 122, a gate terminal coupled with the delay input node 108h, and a source terminal coupled with the constant voltage node 114. In addition, a MOS diode (e.g., diode-connected MOS transistor) MPD is coupled to provide an impedance between the source terminal of MP1 and VREG, and a MOS capacitor MPC is coupled between the first inverter output node 122h and VREG. Thus connected, the impedance provided by MPD and the capacitance of MPC create an RC time constant to provide or otherwise establish a first inverter delay for the first inverter circuit 120. In one high switching frequency example, for instance, the delay time provided by the first CMOS inverter 120h as a nominal value of about 6-8 ns, although not a strict requirement of all possible embodiments. The first inverter stage 120l of the low side delay circuit 110l similarly includes an inverter formed by MP1 and MN1 along with a MOS diode or diode-connected MOS transistor MPD and a MOS capacitor MPC providing an output terminal 122l as shown in FIG. 1.

Figure 7:
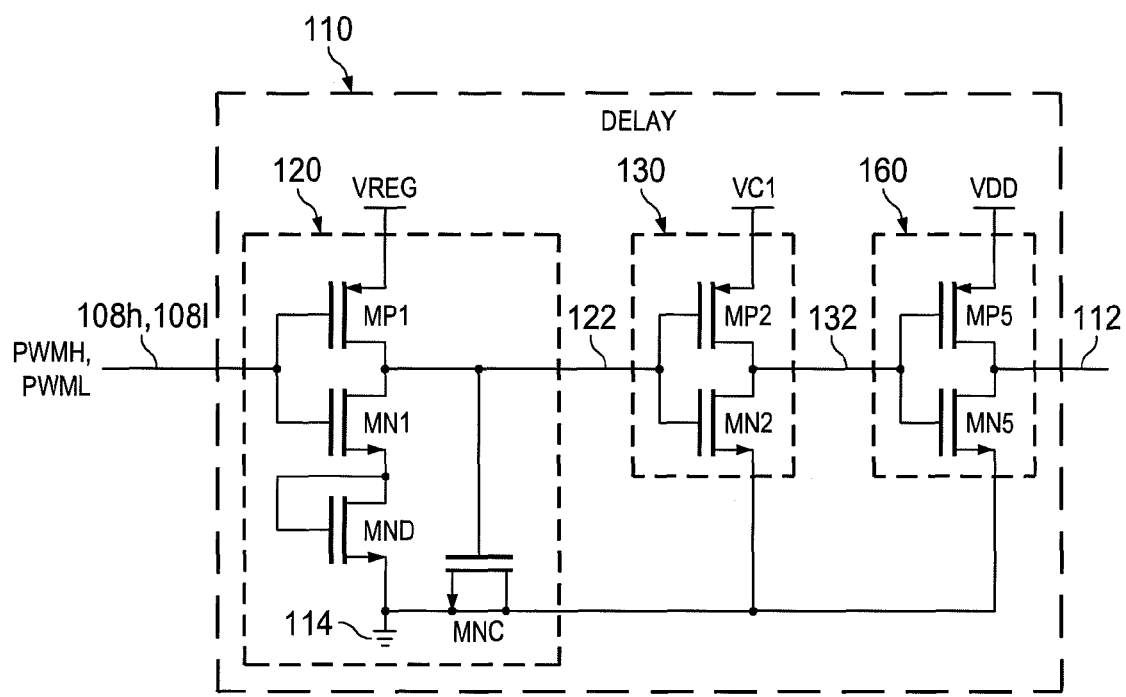
FIG. 7 is a schematic diagram illustrating a further dead time delay circuit embodiment using an NMOS diode-connected transistor and an NMOS capacitor.

Referring briefly to FIG. 7, other embodiments are possible in which the first inverter circuit 120 provides a PMOS transistor MP1 with a source coupled directly to the regulated voltage VREG, and the source of the NMOS transistor MN1 is coupled to the constant voltage node 114 through a MOS diode or diode-connected NMOS transistor MND, and a MOS capacitor MNC is connected between the constant voltage node 114 and the first inverter stage output node 122.

Figure 2:
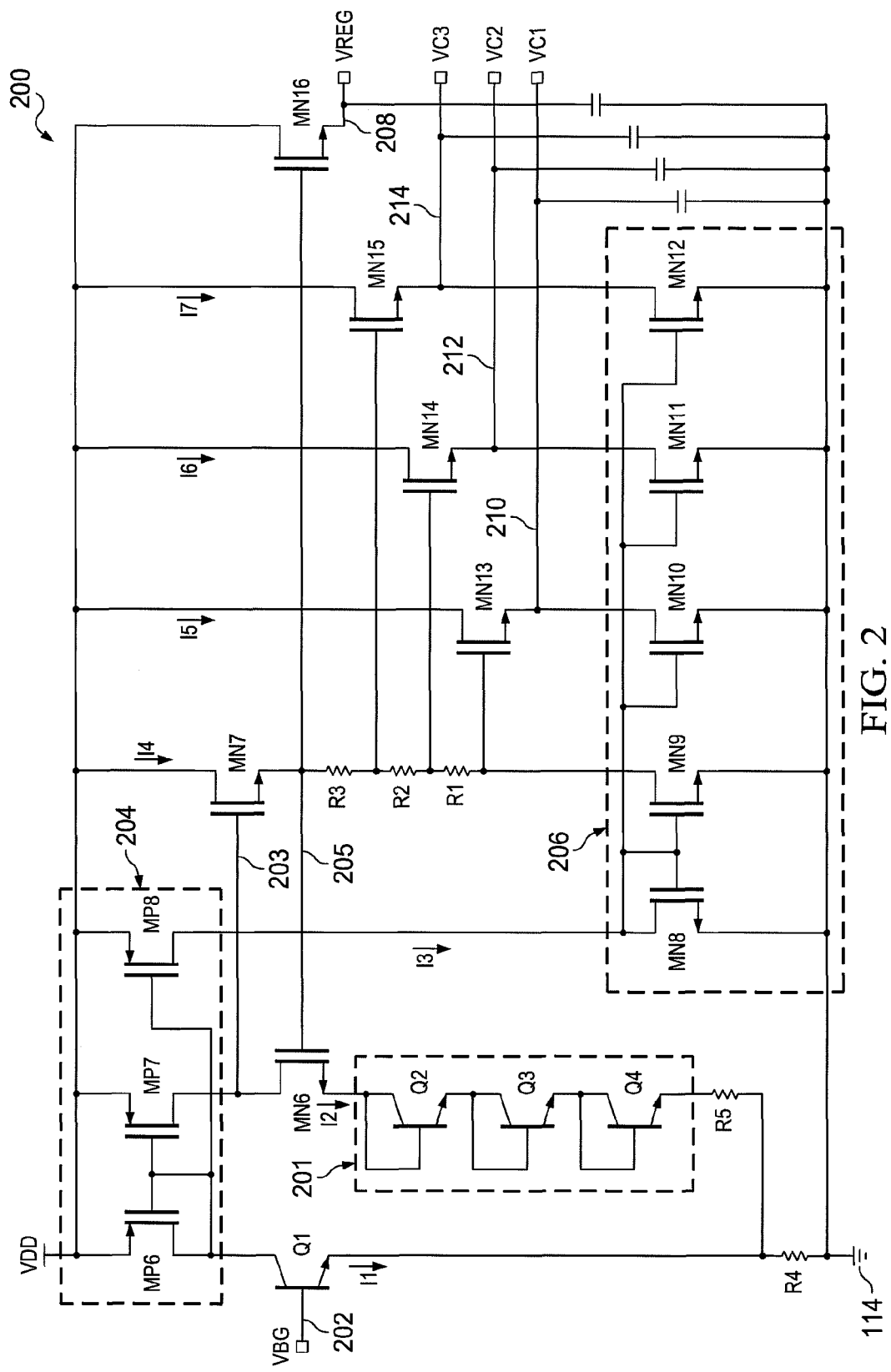
FIG. 2 is a schematic diagram illustrating a supply circuit providing a regulated voltage and one or more compensated voltages to the delay circuits of FIG. 1.
Figure 3:
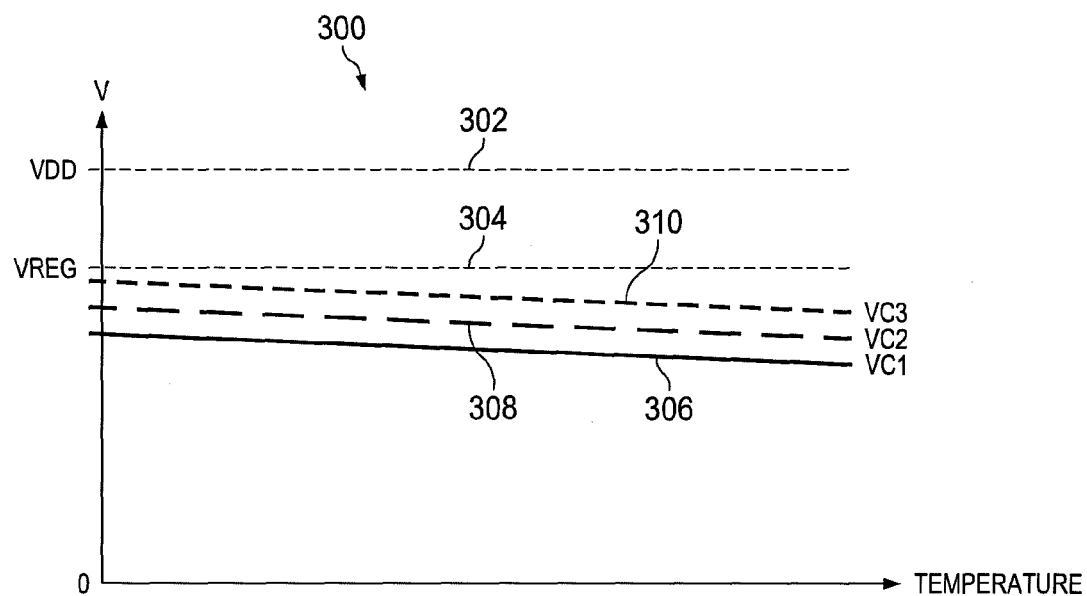
FIG. 3 is a graph illustrating a supply voltage, a regulated voltage, and temperature dependent compensated voltages in the circuits of FIGS. 1 and 2.

Referring now to FIGS. 1-3, a second inverter circuit 130h in FIG. 1 is provided in the high side delay circuit 110h, including a second PMOS transistor MP2 with a source terminal coupled with a first compensated voltage node VC1, a gate terminal coupled with the first inverter output node 122h, and a drain terminal coupled with a second inverter output node 132h, as well as a second NMOS transistor MN2 having a drain terminal coupled with the output node 132h, a gate terminal coupled with the first inverter output node 122h, and a source terminal coupled with the constant voltage node 114. The low side delay circuit 110l includes a similar second inverter circuit 130l providing an output at a second inverter output terminal 132l.

A supply circuit 200 (FIG. 2) provides a first compensated voltage at the node VC1 which is below the regulated voltage VREG and decreases with increasing temperature. In operation, modulation of the supply voltages provided to the CMOS inverter stages 120 and 130 based on an IC supply voltage VDD provides temperature compensation to control the dead time delay provided by the circuits 110h and 110l. In addition, use of the MOS diode or diode-connected MOS transistor MPD as a resistance along with the use of a MOS capacitor MPC provides process compensation to facilitate a controlled dead time delay. Moreover, supply voltage variations are compensated in this design by locally regulating the supply voltage VREG and derivation of the compensated voltage VC1 according to the level of the supply voltage VDD. In addition, the second inverter stage 130 operates as a voltage comparator to compare a threshold voltage of VC1/2 with the voltage across the MOS capacitor MPC, while employing low cost CMOS circuitry. Thus, the disclosed embodiments advantageously avoid the high cost and circuit complexity associated with using conventional voltage comparators and current source/charged capacitor ramp signal generation circuitry, while providing the CMOS inverter stage 130 having a significantly shorter intrinsic delay than that of conventional voltage comparators. As a result, the disclosed concepts find particular utility in high-speed DC to DC switching converter applications, facilitating operation at switching frequencies of 1 MHz or more while providing predictable process, voltage and temperature compensated dead time delays to facilitate converter efficiency.

The delay circuits 110h and 110l in FIG. 1 further include a CMOS output inverter circuit 160 (160h and 160l in FIG. 1), providing the driver input signals DRVH or DRVL to the corresponding driver circuit 106h or 106l at output terminals 112h and 112l, respectively. The output inverter circuit 160 includes a PMOS transistor MP5 having a source terminal coupled with a supply voltage node VDD (e.g., 5 V in one non-limiting example), a gate terminal coupled directly or indirectly with the second inverter output node 132, and a drain terminal coupled with a delay circuit output node 112, as well as an NMOS transistor MN5 having a drain terminal coupled with the output node 112, a gate terminal coupled with gate terminal of MP5, and a source terminal coupled with the constant voltage node 114.

In certain embodiments, as shown in FIG. 1, the delay circuits 110 include one or more further CMOS inverters 140h, 150h (and 140l, 150l) forming a level shifting circuit 134h, 134l which receives an output signal from the corresponding second inverter output node 132 and is operable to provide an output signal to the gate terminals of the output inverter circuit transistors MP5, MN5. As seen in FIG. 1, for example, the high side delay circuit 110h includes a third CMOS inverter 140h with an output node 142h to provide a signal directly to the output inverter 160h or to provide a signal to the output inverter 160h indirectly via a further level shifting CMOS inverter circuit 150h having an output node 152h. Similarly, the low side delay circuit 110l includes CMOS inverter circuits 140l and 150l respectively having output nodes 142l and 152l. Each of the level shifting CMOS inverters includes a PMOS transistor (MP3, MP4) and an NMOS transistor (MN3, MN4) as shown, with the source terminals of the PMOS transistors coupled to a corresponding compensated voltage nodes VC2 and VC3, and with the source terminals of the NMOS transistors coupled with the constant voltage node 114 as shown.

Referring also to FIGS. 2 and 3, the supply circuit 200 is operable to provide the compensated voltages at the nodes VC1, VC2 and VC3 with decreasing values for increasing temperatures, where the supply voltage VDD (e.g., 5 V in one example) is greater than the compensated voltages, and is also greater than the regulated voltage at the node VREG. Moreover, the compensated voltages are supplied by the circuit 200 with successively higher levels for embodiments including a level shifting circuit 134. In the illustrated implementation, for example, VC1<VC2<VC3.

As seen in FIG. 2, the supply circuit 200 includes a first circuit branch Q1, R4 comprising a bipolar transistor Q1 with a base control terminal 202 whose voltage is controlled by a band gap reference voltage VBG to provide a first current signal I1 which increases with increasing temperature due to temperature variations of the transistor Q1 and a series-connected resistor R4 coupled between the emitter of Q1 and the constant voltage node 114. The illustrated supply circuit 200 employs this first current I1 to generate a regulated voltage VREG generally flat over temperature, with the first circuit branch being powered from a supply voltage VDD for voltage compensation as described further below. The supply circuit 200 includes a temperature compensation circuit 201 in a second circuit branch for regulating generally constant voltages at the source of MN6, as well as first and second current mirror circuits 204 and 206, a first NMOS output transistor MN16 providing the regulated output voltage VREG at an output node 208, and NMOS output transistors MN13-MN15 providing first second and third compensated voltages VC1, VC2 and VC3 at corresponding output nodes 210, 212 and 214, respectively.

The first current mirror circuit 204 includes an input transistor MP6 coupled between VDD and the first circuit branch to receive the first current signal I1 from the first current branch Q1, R4, with the gate and drain of MP6 connected to the gates of PMOS transistors MP7 and MP8 to provide a second current signal I2 and a third current signal I3, respectively, where I2 and I3 are proportional to the first current signal I1 based on the relative sizes of MP6-MP8, and the currents I2 and I3 also increase with increasing temperature. Any suitable current mirror ratios can be used for the first and second current mirror circuits 204 and 206 in various embodiments.

The second circuit branch in FIG. 2 is formed by series connection of an NMOS transistor MN6 and one or more diode-connected bipolar transistors Q2, Q3 and Q4, as well as a resistor R5, where the second circuit branch conducts the second current I2 provided by transistor MP7 of the first current mirror circuit 204. As shown, the gate of MN6 is connected to a first internal node 205 and the drain of MN6 is coupled with the drain of MP7 at node 203. The diode-connected bipolar transistors Q2-Q4 form a temperature compensation circuit 201 which is operable when conducting the current I2 to provide a voltage drop between the source of MN6 and the upper terminal of the resistor R5 which decreases with increasing temperature. In this regard, the second current signal I2 (like I1) increases with increasing temperature, and the corresponding voltage across R5 increases with increasing temperature. Thus, the voltage at the upper terminal of R5 will generally increase with increasing temperature. However, the voltage drop across the temperature compensation circuit 201 decreases with increasing temperature, and thus the circuit 201 at least partially counteracts increases of the second current signal I2 with increasing temperature to provide a temperature compensated voltage at the source of MN6 which is generally flat (e.g., generally constant) over temperature relative to the supply voltage VDD. The supply circuit 200 of FIG. 2 provides a constant regulated voltage VREG with sourcing capability, where the source of MN6 is made to be a constant voltage, e.g., about 3 times the band gap reference voltage VBG in the illustrated embodiment. In this case, the voltage at node 205 is 3*VBG plus the gate-source voltage VGS of MN6, and VREG is the voltage at node 205 minus the gate-source voltage VGS of the output transistor MN16. In certain embodiments, where the gate-source voltages of MN6 and MN16 are substantially equal, the regulated voltage VREG is thus about the same as 3*VBG, and is generally constant over temperature relative to VDD. In this manner, VREG is locally regulated and is compensated with respect to temperature by operation of the temperature compensation circuit 201. Moreover, VREG is generally constant over process, temperature and supply variations at about three times the bandgap voltage VBG in certain embodiments, and thus the regulated voltage used to supply the first inverter stages 120 is compensated with respect to voltage variations.

As further shown in FIG. 2, the supply circuit 200 also includes a circuit branch connecting the drains of MP8 and MN8 to provide the third current signal I3 output by the first current mirror circuit 204 as an input current to the NMOS input transistor MN8 of the second current mirror circuit 206. The second current mirror circuit 206 includes mirrored (e.g., NMOS) output transistors MN9, MN10, MN11 and MN12 conducting mirrored current signals I4, I5, I6 and I7 as shown, where the mirrored output signals I4-I7 are generally proportional to I1 through the operation of the mirror circuits 204 and 206, and thus I4-I7 also increase with increasing temperature.

In order to generate the compensated voltages VC1-VC3, the supply circuit 200 further includes a third circuit branch formed by transistors MN7 and MN9 as well as intervening resistors R1-R3 coupled with the second current mirror circuit 206 to receive the fourth current signal I4. The NMOS transistor MN7 has a gate connected to the node 203 and a source connected to the first internal node 205, and the resistors R1-R3 are connected in series with one another between the source of MN7 and the drain of the current mirror transistor MN9. In this configuration, since the mirrored current I4 increases with increasing temperature, the voltages at the lower terminal of R1-R3 will decrease relative node 205 (and hence relative to VREG) with increasing current and hence with increasing temperature, since the voltage at the upper terminal of R3 is generally constant over temperature relative to VDD.

FIG. 3 shows a graph 300 illustrating voltage curves 302-310 corresponding to the supply voltage VDD (curve 302), the regulated voltage VREG (curve 304), and the three example compensated voltages VC1, VC2 and VC3 (curves 306, 308 and 310, respectively) as a function of temperature. As seen in the graph 300, the compensated voltages 306, 308 and 310 each decrease with increasing temperature, due to the decreasing voltages at the lower terminals of the corresponding resistors R1-R3 in the third circuit branch caused by the increase in the current signal I4 with increasing temperature. Moreover, the values of the resistances R1-R3 can be tailored to adjust the slopes of the curves 306-310 to accommodate various implementation design parameters. Moreover, the voltage gaps between the compensated voltages VC1-VC3 can be adjusted by selection of the resistance values for R1, R2 and R3, which may, but need not be equal. In one example, for a nominal VDD of 5 V, VREG is approximately 3.75 V at room temperature and the compensated voltages VC1, VC2 and VC3 are approximately 0.4 V apart with VC3>VC2>VC1.

The lower terminal of R1 is coupled with the gate of an output transistor MN13 coupled between VDD and output transistor MN10 of the second current mirror circuit 206 to conduct the fifth current signal I5, with the source of MN13 providing the first compensated voltage VC1 at the output terminal 210 to supply the second inverter circuit of the delay circuits 110. The lower terminal of R2 is similarly coupled with the gate of another output transistor MN14 conducting mirrored current signal I6 via current mirror output transistor MN11, with the source of MN14 providing VC2 at node 212 to supply the initial level shifting CMOS inverter circuits 140, and the lower terminal of R3 is coupled with the gate of output transistor MN15, which conducts the current signal I7 via mirror transistor MN12 to provide the third compensated voltage VC3 at node 214 to power the second level shifting CMOS inverter circuits 150. As seen in FIG. 2, moreover, capacitors (e.g., a few pf in one example) are provided between the compensated voltage nodes VC1, VC2 and VC3 and ground 114 in certain embodiments.

As shown in the graph 300 of FIG. 3, the compensated voltage curves 306-310 are all lower than the regulated voltage curve 310, as the voltage drops across the corresponding resistors R1-R3 ensure that the compensated voltages are below the regulated voltage level. Any number of level shifting CMOS inverter circuits 140, 150 can be provided to form a level shifting circuit 134 in the delay circuit 110, and certain implementations provide no level shifting circuit 134, as seen below in FIGS. 4-6. Thus, while the illustrated supply circuit 200 of FIG. 2 provides three compensated voltage outputs VC1-VC3, any integer number of such compensated supply voltages can be provided in various embodiments, with at least one compensated supply voltage VC1 being provided to supply the second inverter circuit 130 of the delay circuitry 110 with a voltage that decreases with increasing temperature. For example, additional CMOS inverters (not shown) can be provided in the level shifting circuit 134, with the supply circuit including additional resistors in the third circuit branch in series with R1-R3, with connection to corresponding output transistors (not shown) for supplying the corresponding additional level shifting CMOS inverters in the delay circuit 110. In the illustrated embodiment, moreover, the resistances R1-R3 are generally equal, thus providing generally equal voltage spacing between the resulting compensated voltages VC1-VC3, although not a strict requirement of all possible embodiments, wherein the overall values and relative values of R1-R3 can be tailored for specific applications.

As seen in FIGS. 1-3, the inclusion of one or more level shifting inverter circuits 140, 150 powered by corresponding compensated voltages which decrease with increasing temperature facilitates the use of the second inverter circuit 130 as a single ended voltage comparator with a relatively small intrinsic delay, while this inverter-implemented comparator 130 is supplied with a temperature compensated supply voltage VC1 such that changes in operating temperature do not significantly alter the delay time of the delay circuit 110. Furthermore, this approach employs CMOS inverter circuits without introducing significant cost or complexity, while significantly lowering the intrinsic delay relative to conventional voltage comparator and ramp generator circuits, to provide dead time delay control stability over process, voltage and temperature in a DC to DC converter system 100.

Figure 4:
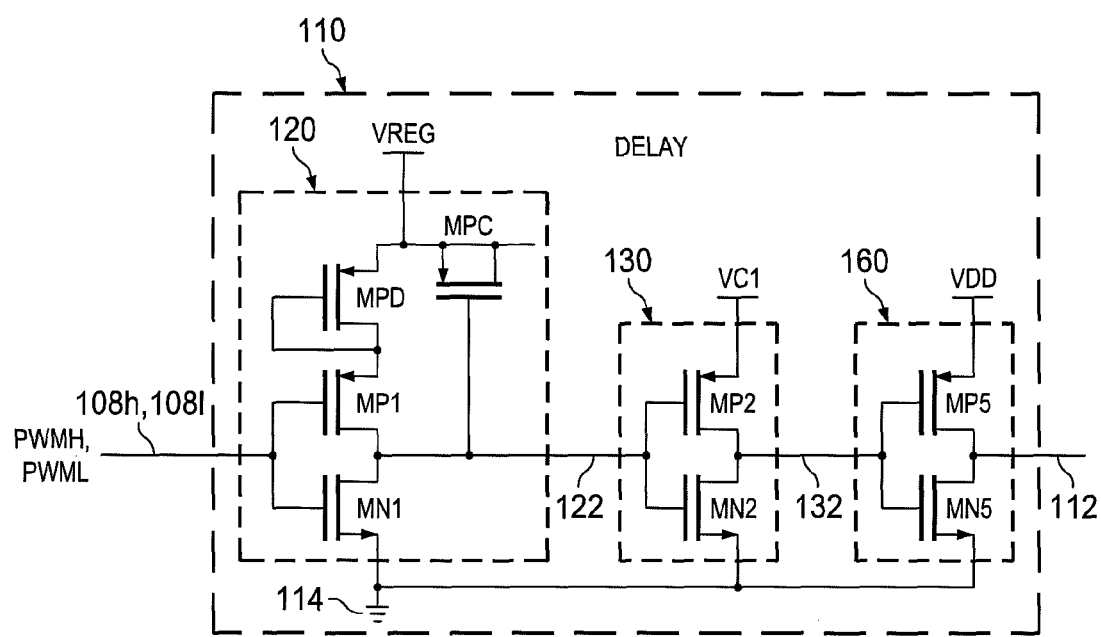
FIG. 4 is a schematic diagram illustrating another process, voltage and temperature compensated dead time delay circuit embodiment without a level shifting circuit.
Figure 5:
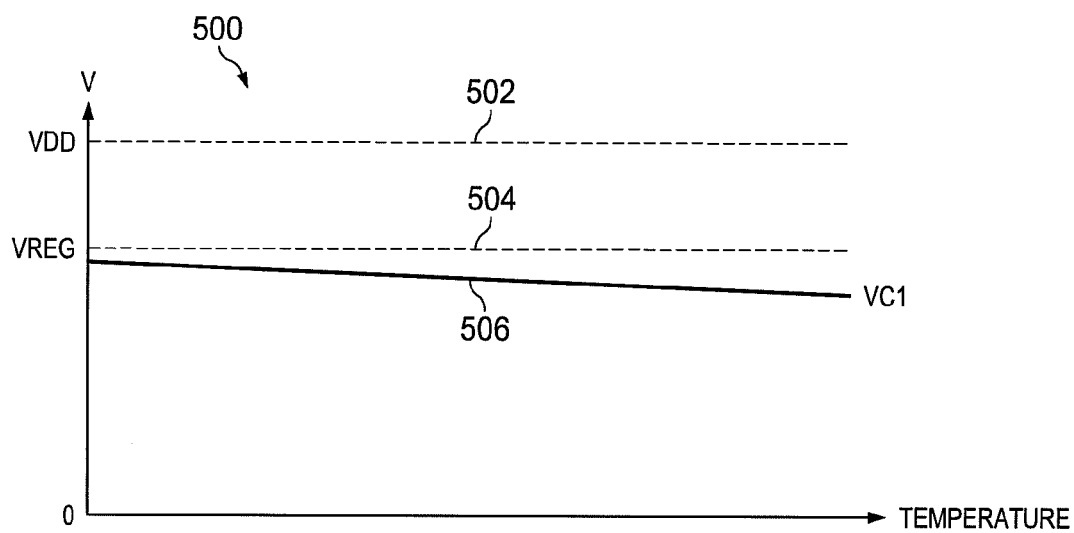
FIG. 5 is a graph illustrating a supply voltage, regulated voltage and a temperature dependent compensated voltage in the circuit of FIG. 4.
Figure 6:
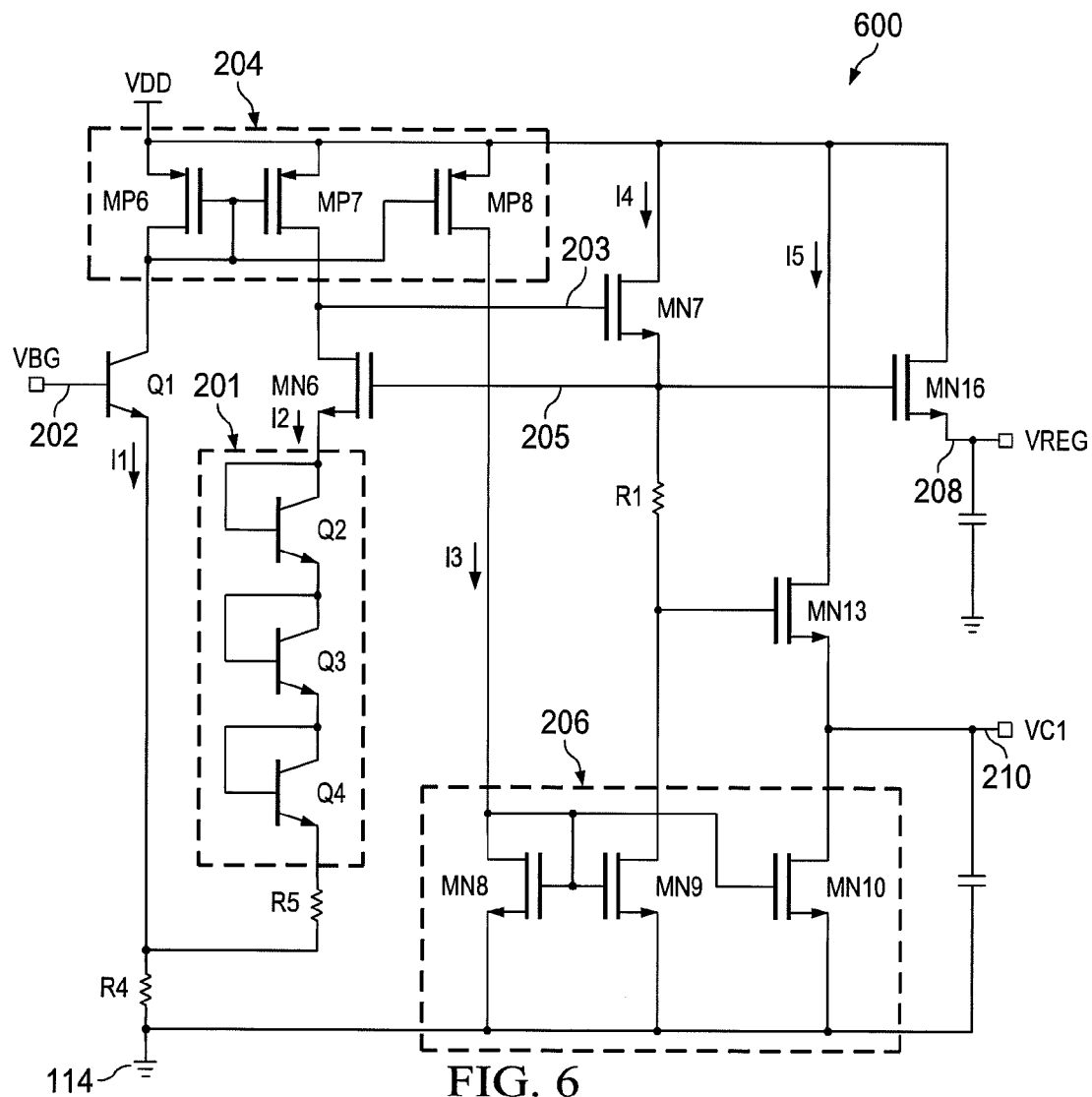
FIG. 6 is a schematic diagram illustrating another supply circuit embodiment providing a regulated voltage and a compensated voltage to the delay circuit of FIG. 4.

Referring now to FIGS. 4-6, another non-limiting embodiment of a delay circuit 110 is shown in FIG. 4, including a first CMOS inverter circuit 120 receiving a pulse width modulation input signal from the PWM circuit 108 (FIG. 1), including a PMOS transistor MP1 and an NMOS transistor MN1, along with a diode-connected MOS transistor (e.g., MOS diode) MPD and a MOS capacitor MPC generally as described above in connection with FIG. 1, and powered by the regulated voltage VREG. The embodiment of FIG. 4 also includes a second inverter 130 generally as described above, and powered by a compensated voltage VC1 which decreases with increasing temperature. In this case, however, the output node 132 of the second inverter 130 is directly coupled to provide an input signal to the final or output CMOS inverter circuit 160 without intervening level shifting circuitry. FIG. 5 provides a graph 500 illustrating example voltage curves for the supply voltage VDD (curve 502), the regulated voltage VREG (curve 504) and the single compensated voltage VC1 (curve 506) in the delay circuit 110 of FIG. 4.

Referring also to FIG. 6, another embodiment of a supply circuit 600 is illustrated, providing the regulated voltage VREG which is generally constant or flat over temperature, and which varies according to the supply voltage VDD, along with a compensated voltage VC1 which also varies according to the supply voltage VDD, and which decreases with increasing temperature. In this regard, various designs may not need voltage level shifting between the output node 132 of the second inverter 130 and the output inverter circuit 160, depending on the voltage difference between the supply voltage VDD and the regulated voltage VREG. The supply circuit 600 in FIG. 6 generally operates in similar fashion to the supply circuit 200 of FIG. 2 above, with the first circuit branch formed by Q1 and R4 providing a first current signal I1 as an input signal to the first current mirror circuit 204, and with the second circuit branch (MN6, circuit 201, and resistor R5) providing a generally temperature independent voltage at the source of MN6. Also, the third circuit branch in FIG. 6 includes a resistance R1 connected in series between the first internal node 205 and the current mirror transistor MN9 to conduct the fourth current signal I4. Since there is only one compensated voltage VC1 in this embodiment, only a single resistance R1 and corresponding output transistor MN13 are provided for generating the compensated voltage at the output node 210. As in the above embodiment, moreover, the circuit 600 in FIG. 6 also includes a first output transistor MN16 with a gate coupled to the first internal node 205 in order to provide the regulated voltage VREG at the node 208 as shown.

Referring again to FIG. 7, another delay circuit embodiment 110 is shown, in which no level shifting inverter circuit 134 is provided between the second inverter circuit 130 and the output inverter circuit 160. In this case, in contrast to the example of FIG. 4, a diode-connected NMOS transistor MND is coupled to provide an impedance (e.g., resistance) between the source of the lower NMOS transistor MN1 of the first CMOS inverter circuit 120 and the constant voltage node 114, and an NMOS capacitor MNC is coupled between the first inverter output node 122 and the constant voltage node 114, with MND and MNC providing an RC time constant to establish or set the delay time of the first CMOS inverter circuit 120. Like the other embodiments of FIGS. 1 and 4 above, moreover, the second CMOS inverter circuit 130 operates as a comparator with a threshold of VC1/2 in order to detect a rising transition of the voltage across the charging capacitor MNC for a controlled delay, where the CMOS inverter circuit 130 providing the comparator functions has a significantly shorter intrinsic delay than conventional voltage comparator circuits and corresponding charged capacitor/current source ramp generator circuits. Moreover, as discussed above, the dead time delay circuitry 110 of the various embodiments advantageously provides compensation with respect to process, voltage and temperature variations, and thus facilitates a significant advance over conventional circuitry with respect to high switching frequency operation of a DC to DC conversion system 100 at high switching frequencies without unduly adding cost or complexity to a PWM controller IC.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A delay circuit for providing a dead time delay to operate a driver transistor of a switching DC to DC conversion system, the delay circuit comprising:
    a first inverter circuit, comprising:
        a first transistor having a source terminal coupled with a regulated voltage node, a gate terminal coupled with a delay input node to receive a delay circuit input voltage signal, and a drain terminal coupled with a first inverter output node, and
        a second transistor having a drain terminal coupled with the first inverter output node, a gate terminal coupled with the delay input node, and a source terminal coupled with a constant voltage node;
    a diode-connected MOS transistor coupled to provide an impedance between the first inverter circuit and a first one of the regulated voltage node and the constant voltage node;
    a MOS capacitor coupled between the first inverter output node and the first one of the regulated voltage node and the constant voltage node, the MOS capacitor and the diode-connected MOS transistor establishing a first inverter delay for the first inverter circuit;
    a second inverter circuit, comprising:
        a third transistor having a source terminal coupled with a first compensated voltage node, a gate terminal coupled with the first inverter output node, and a drain terminal coupled with a second inverter output node, and
        a fourth transistor having a drain terminal coupled with the second inverter output node, a gate terminal coupled with the first inverter output node, and a source terminal coupled with the constant voltage node; and
    an output inverter circuit, comprising:
        a fifth transistor having a source terminal coupled with a supply voltage node, a gate terminal coupled with the second inverter output node, and a drain terminal coupled with a delay circuit output node, and
        a sixth transistor having a drain terminal coupled with the delay circuit output node, a gate terminal coupled with the second inverter output node, and a source terminal coupled with the constant voltage node; and
    a supply circuit providing a voltage at the first compensated voltage node which decreases with increasing temperature.

2. The delay circuit of claim 1:
    wherein a voltage at the supply voltage node is greater than a voltage at the regulated voltage node;
    wherein the voltage at the regulated voltage node is greater than the voltage at the first compensated voltage node; and
    wherein the delay circuit comprises a level shifting circuit coupled to receive an output signal from the second inverter output node and to provide an output signal to the gate terminals of the output inverter circuit transistors.

3. The delay circuit of claim 2, wherein the level shifting circuit comprises:
    a third inverter output node coupled directly or indirectly with the gate terminals of the output inverter circuit transistors;
    a seventh transistor having a source terminal coupled with a second compensated voltage node, a gate terminal coupled with the second inverter output node, and a drain terminal coupled with the third inverter output node; and
    an eighth transistor having a drain terminal coupled with the third inverter output node, a gate terminal coupled with the second inverter output node, and a source terminal coupled with the constant voltage node;
    wherein the supply circuit provides a voltage at the second compensated voltage node greater than the voltage at the first compensated voltage node; and
    wherein the voltage at the second compensated voltage node decreases with increasing temperature.

4. The delay circuit of claim 3, wherein the supply circuit comprises:
    a first circuit branch including a resistor and a first circuit branch transistor controlled by a reference voltage to provide a first current signal which increases with increasing temperature;
    a first current mirror circuit, comprising: an input transistor coupled to receive the first current signal from the first current branch, and an output providing a second current signal and a third current signal proportional to the first current signal;
    a second circuit branch coupled with the first current mirror circuit to receive the second current signal, the second circuit branch comprising:
        a second circuit branch transistor having at least one terminal connected to a first internal node, and
        a temperature compensation circuit coupled in series with the second circuit branch transistor between the output of the first current mirror circuit and the constant voltage node, the temperature compensation circuit comprising at least one diode-connected transistor operable when conducting the second current signal to provide a voltage drop across the temperature compensation circuit which decreases with increasing temperature to at least partially counteract increases of the second current signal with increasing temperature to provide a temperature compensated voltage at the first internal node;
    a first output transistor having a gate terminal coupled with the first internal node and operable to generate the voltage at the regulated voltage node;
    a second current mirror circuit comprising: an input transistor coupled to receive the third current signal from the first current mirror circuit, and an output providing a fourth current signal proportional to the third current signal;
    a third circuit branch coupled with the second current mirror circuit to receive the fourth current signal, the third circuit branch comprising a third circuit branch transistor, a first resistance, and a second resistance coupled in series with one another between the supply voltage node and the second current mirror circuit, the third circuit branch transistor having a gate terminal coupled with the second circuit branch and at least one terminal connected to the first internal node;

a second output transistor having a gate terminal coupled with the first resistance of the third circuit branch and operable to generate the voltage at the first compensated voltage node which decreases with increasing temperature; and a third output transistor having a gate terminal coupled with the second resistance of the third circuit branch and operable to generate the voltage at the second compensated voltage node which decreases with increasing temperature.

5. The delay circuit of claim 2, wherein the level shifting circuit comprises a plurality of CMOS inverter circuits including a first CMOS inverter circuit coupled to receive the output signal from the second inverter output node and to provide an output signal to a succeeding CMOS inverter, and a final CMOS inverter circuit coupled to provide an output signal to the gate terminals of the output inverter circuit transistors; wherein each CMOS inverter circuit of the level shifting circuit includes a transistor coupled with a corresponding compensated voltage node at a voltage greater than a voltage of the compensated voltage node of the preceding inverter circuit; and wherein the voltage at each compensated voltage node decreases with increasing temperature.

6. The delay circuit of claim 5, wherein the supply circuit comprises:
  a first circuit branch including a resistor and a first circuit branch transistor controlled by a reference voltage to provide a first current signal which increases with increasing temperature;
  a first current mirror circuit, comprising: an input transistor coupled to receive the first current signal from the first current branch, and an output providing a second current signal and a third current signal proportional to the first current signal;
  a second circuit branch coupled with the first current mirror circuit to receive the second current signal, the second circuit branch comprising:
    a second circuit branch transistor having at least one terminal connected to a first internal node, and
    a temperature compensation circuit coupled in series with the second circuit branch transistor between the output of the first current mirror circuit and the constant voltage node, the temperature compensation circuit comprising at least one diode-connected transistor operable when conducting the second current signal to provide a voltage drop across the temperature compensation circuit which decreases with increasing temperature to at least partially counteract increases of the second current signal with increasing temperature to provide a temperature compensated voltage at the first internal node;
  a first output transistor having a gate terminal coupled with the first internal node and operable to generate the voltage at the regulated voltage node;
  a second current mirror circuit comprising: an input transistor coupled to receive the third current signal from the first current mirror circuit, and an output providing a fourth current signal proportional to the third current signal;
  a third circuit branch coupled with the second current mirror circuit to receive the fourth current signal, the third circuit branch comprising a third circuit branch transistor and a plurality of resistances coupled in series with one another between the supply voltage node and the second current mirror circuit, the third circuit branch transistor having a gate terminal coupled with the second circuit branch and at least one terminal connected to the first internal node;
  a plurality of output transistors individually including a gate terminal coupled with a corresponding the plurality of resistances of the third circuit branch and individually operable to generate a voltage a corresponding compensated voltage node which decreases with increasing temperature.

7. The delay circuit of claim 2, wherein the diode-connected MOS transistor is a PMOS transistor comprising a source terminal coupled with the regulated voltage node, and source and drain terminals coupled with the source terminal of the first transistor to provide the impedance between the first inverter circuit and the regulated voltage node; and wherein the MOS capacitor is coupled between the first inverter output node and the regulated voltage node.

8. The delay circuit of claim 1, wherein the supply circuit comprises:
  a first circuit branch including a resistor and a first circuit branch transistor controlled by a reference voltage to provide a first current signal which increases with increasing temperature;
  a first current mirror circuit, comprising: an input transistor coupled to receive the first current signal from the first current branch, and an output providing a second current signal and a third current signal proportional to the first current signal;
  a second circuit branch coupled with the first current mirror circuit to receive the second current signal, the second circuit branch comprising:
    a second circuit branch transistor having at least one terminal connected to a first internal node, and
    a temperature compensation circuit coupled in series with the second circuit branch transistor between the output of the first current mirror circuit and the constant voltage node, the temperature compensation circuit comprising at least one diode-connected transistor operable when conducting the second current signal to provide a voltage drop across the temperature compensation circuit which decreases with increasing temperature to at least partially counteract increases of the second current signal with increasing temperature to provide a temperature compensated voltage at the first internal node;
  a first output transistor having a gate terminal coupled with the first internal node and operable to generate the voltage at the regulated voltage node;
  a second current mirror circuit comprising: an input transistor coupled to receive the third current signal from the first current mirror circuit, and an output providing a fourth current signal proportional to the third current signal;
  a third circuit branch coupled with the second current mirror circuit to receive the fourth current signal, the third circuit branch comprising a third circuit branch transistor and a resistance coupled in series with one another between the supply voltage node and the second current mirror circuit, the third circuit branch transistor having a gate terminal coupled with the second circuit branch and at least one terminal connected to the first internal node; and
  a second output transistor having a gate terminal coupled with the resistance of the third circuit branch and operable to generate the voltage at the first compensated voltage node which decreases with increasing temperature.

9. The delay circuit of claim 8, wherein the second circuit branch comprises a resistor coupled between the temperature compensation circuit and the resistor of the first circuit branch, and wherein the second circuit branch transistor includes a gate terminal connected to the first internal node, a drain terminal coupled to receive the second current signal first current mirror circuit, and a source terminal coupled with the temperature compensation circuit.

10. The delay circuit of claim 8, wherein the diode-connected MOS transistor is a PMOS transistor comprising a source terminal coupled with the regulated voltage node, and source and drain terminals coupled with the source terminal of the first transistor to provide the impedance between the first inverter circuit and the regulated voltage node; and wherein the MOS capacitor is coupled between the first inverter output node and the regulated voltage node.

11. The delay circuit of claim 1, wherein the diode-connected MOS transistor is a PMOS transistor comprising a source terminal coupled with the regulated voltage node, and source and drain terminals coupled with the source terminal of the first transistor to provide the impedance between the first inverter circuit and the regulated voltage node; and wherein the MOS capacitor is coupled between the first inverter output node and the regulated voltage node.

12. The delay circuit of claim 1, wherein the diode-connected MOS transistor is an NMOS transistor comprising a source terminal coupled with the constant voltage node, and source and drain terminals coupled with the source terminal of the second transistor to provide the impedance between the first inverter circuit and the constant voltage node; and wherein the MOS capacitor is coupled between the first inverter output node and the constant voltage node.

13. A DC to DC conversion system, comprising:
a high side switching device coupled with a switching node;
a high side driver circuit coupled with a control terminal of the high side switching device and operable according to a high side input signal to selectively turn the high side switching device on or off;
a low side switching device coupled with the switching node;
a low side driver circuit coupled with a control terminal of the low side switching device and operable according to a low side input signal to selectively turn the low side switching device on or off;
a pulse width modulation (PWM) circuit having a first output operable to provide a high side PWM signal for controlling the high side switching device, and a second output operable to provide a low side PWM signal for controlling the low side switching device to modulate a voltage at the switching node;
a high side delay circuit having a high side delay input coupled with the first output of the PWM circuit to receive the high side PWM signal, and a high side delay output operable to provide the high side input signal at least partially according to the high side PWM signal with a non-zero first temperature compensated delay;
a low side delay circuit having a low side delay input coupled with the second output of the PWM circuit to receive the low side PWM signal, and a low side delay output operable to provide the low side input signal at least partially according to the low side PWM signal with a non-zero second temperature compensated delay;

wherein the high side and low side delay circuits individually comprise a plurality of cascaded CMOS inverter circuits including:
a first CMOS inverter circuit powered from a regulated voltage node and comprising an input receiving the corresponding PWM signal from the PWM circuit, and a first inverter output node;
a diode-connected MOS transistor coupled to provide an impedance between the first CMOS inverter circuit and a first one of a regulated voltage node and a constant voltage node;
a MOS capacitor coupled between the first inverter output node and the first one of the regulated voltage node and the constant voltage node;
a second CMOS inverter circuit powered from a first compensated voltage node and comprising an input coupled with the first inverter output node, and a second inverter output node; and
an output CMOS inverter circuit powered from a supply voltage node and an output operable to provide the corresponding high or low side input signal to the corresponding driver circuit; and
a supply circuit providing a voltage at the first compensated voltage node which decreases with increasing temperature.

14. The DC to DC conversion system of claim 13:
wherein a voltage at the supply voltage node is greater than a voltage at the regulated voltage node;
wherein the voltage at the regulated voltage node is greater than the voltage at the first compensated voltage node; and
wherein the high and low side delay circuits individually comprise a level shifting circuit coupled to receive an output signal from the second inverter output node and to provide an output signal to the output CMOS inverter circuit.

15. The DC to DC conversion system of claim 14, wherein the level shifting circuit comprises a third CMOS inverter circuit powered from a second compensated voltage node and comprising an input coupled with the second inverter output node, and a third inverter output node coupled directly or indirectly with the output CMOS inverter circuit;
wherein the supply circuit provides a voltage at the second compensated voltage node greater than the voltage at the first compensated voltage node; and
wherein the voltage at the second compensated voltage node decreases with increasing temperature.

16. The DC to DC conversion system of claim 14, wherein the supply circuit comprises:
a first circuit branch including a resistor and a first circuit branch transistor controlled by a reference voltage to provide a first current signal which increases with increasing temperature;
a first current mirror circuit, comprising: an input transistor coupled to receive the first current signal from the first circuit branch, and an output providing a second current signal and a third current signal proportional to the first current signal;
a second circuit branch coupled with the first current mirror circuit to receive the second current signal, the second circuit branch comprising:
a second circuit branch transistor having at least one terminal connected to a first internal node, and
a temperature compensation circuit coupled in series with the second circuit branch transistor between the output of the first current mirror circuit and the constant voltage node, the temperature compensation circuit comprising at least one diode-connected transistor operable when conducting the second current signal to provide a voltage drop across the temperature compensation circuit which decreases with increasing temperature to at least partially counteract increases of the second current signal with increasing temperature to provide a temperature compensated voltage at the first internal node;

a first output transistor having a gate terminal coupled with the first internal node and operable to generate the voltage at the regulated voltage node;

a second current mirror circuit comprising: an input transistor coupled to receive the third current signal from the first current mirror circuit, and an output providing a fourth current signal proportional to the third current signal;

a third circuit branch coupled with the second current mirror circuit to receive the fourth current signal, the third circuit branch comprising a third circuit branch transistor and a resistance coupled in series with one another between the supply voltage node and the second current mirror circuit, the third circuit branch transistor having a gate terminal coupled with the second circuit branch and at least one terminal connected to the first internal node; and a second output transistor having a gate terminal coupled with the resistance of the third circuit branch and operable to generate the voltage at the first compensated voltage node which decreases with increasing temperature.

17. The DC to DC conversion system of claim 13, wherein the supply circuit comprises:

a first circuit branch including a resistor and a first circuit branch transistor controlled by a reference voltage to provide a first current signal which increases with increasing temperature;

a first current mirror circuit, comprising: an input transistor coupled to receive the first current signal from the first current branch, and an output providing a second current signal and a third current signal proportional to the first current signal;

a second circuit branch coupled with the first current mirror circuit to receive the second current signal, the second circuit branch comprising:
　a second circuit branch transistor having at least one terminal connected to a first internal node, and
　a temperature compensation circuit coupled in series with the second circuit branch transistor between the output of the first current mirror circuit and the constant voltage node, the temperature compensation circuit comprising at least one diode-connected transistor operable when conducting the second current signal to provide a voltage drop across the temperature compensation circuit which decreases with increasing temperature to at least partially counteract increases of the second current signal with increasing temperature to provide a temperature compensated voltage at the first internal node;

a first output transistor having a gate terminal coupled with the first internal node and operable to generate the voltage at the regulated voltage node;

a second current mirror circuit comprising: an input transistor coupled to receive the third current signal from the first current mirror circuit, and an output providing a fourth current signal proportional to the third current signal;

a third circuit branch coupled with the second current mirror circuit to receive the fourth current signal, the third circuit branch comprising a third circuit branch transistor and a resistance coupled in series with one another between the supply voltage node and the second current mirror circuit, the third circuit branch transistor having a gate terminal coupled with the second circuit branch and at least one terminal connected to the first internal node; and a second output transistor having a gate terminal coupled with the resistance of the third circuit branch and operable to generate the voltage at the first compensated voltage node which decreases with increasing temperature.

18. The DC to DC conversion system of claim 13, wherein the diode-connected MOS transistor is an NMOS transistor comprising a source terminal coupled with the regulated voltage node, and source and drain terminals coupled with the first CMOS inverter circuit to provide the impedance between the first CMOS inverter circuit and the regulated voltage node; and wherein the MOS capacitor is coupled between the first inverter output node and the regulated voltage node.

19. The DC to DC conversion system of claim 13, wherein the diode-connected MOS transistor is an NMOS transistor comprising a source terminal coupled with the constant voltage node, and source and drain terminals coupled with the first CMOS inverter circuit to provide the impedance between the first CMOS inverter circuit and the constant voltage node; and wherein the MOS capacitor is coupled between the first inverter output node and the constant voltage node.

20. An integrated circuit product, comprising:

a pulse width modulation (PWM) circuit having an output operable to provide a PWM signal for controlling a DC to DC converter switching device;

a delay circuit having a delay input coupled with the output of the PWM circuit to receive the PWM signal, and a delay output operable to provide a driver input signal at least partially according to the PWM signal with a non-zero temperature compensated delay, the delay circuit comprising:
　a first CMOS inverter circuit powered from a regulated voltage node and comprising an input receiving the PWM signal from the PWM circuit, and a first inverter output node;
　a diode-connected MOS transistor coupled to provide an impedance between the first CMOS inverter circuit and a first one of a regulated voltage node and a constant voltage node;
　a MOS capacitor coupled between the first inverter output node and the first one of the regulated voltage node and the constant voltage node;
　a second CMOS inverter circuit powered from a first compensated voltage node at a voltage which decreases with increasing temperature, the second CMOS inverter circuit comprising an input coupled with the first inverter output node, and a second inverter output node; and
　an output CMOS inverter circuit powered from a supply voltage node and operable to provide the driver input signal based at least partially on a signal from the second inverter output node.

* * * * *